United States Patent
Appell et al.

(10) Patent No.: US 9,445,169 B2
(45) Date of Patent: Sep. 13, 2016

(54) SOUND REPRODUCTION DEVICE INCLUDING AUDITORY SCENARIO SIMULATION

(71) Applicant: FRAUNHOFER-GESELLSCHAFT ZUR FOERDERUNG DER ANGEWANDTEN FORSCHUNG E.V., Munich (DE)

(72) Inventors: Jens Ekkehart Appell, Achternmeer (DE); Jan Rennies, Oldenburg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 243 days.

(21) Appl. No.: 14/089,637

(22) Filed: Nov. 25, 2013

(65) Prior Publication Data
US 2014/0079243 A1   Mar. 20, 2014

Related U.S. Application Data

(63) Continuation of application No. PCT/EP2012/059087, filed on May 15, 2012.

(30) Foreign Application Priority Data

May 25, 2011   (DE) .................. 10 2011 076 484

(51) Int. Cl.
*H04B 1/00*   (2006.01)
*H04R 1/00*   (2006.01)
*H03G 3/32*   (2006.01)
(Continued)

(52) U.S. Cl.
CPC .......... *H04R 1/00* (2013.01); *H03G 3/32* (2013.01); *H03G 5/025* (2013.01); *H03G 5/165* (2013.01)

(58) Field of Classification Search
CPC ............... H04R 2499/13; H04R 3/04
USPC ......................... 381/86, 101, 103
See application file for complete search history.

(56) References Cited

U.S. PATENT DOCUMENTS 5,844,992 A   12/1998   Boyer
7,853,028 B2  12/2010   Fischer
(Continued)

FOREIGN PATENT DOCUMENTS

DE   19737732   3/1999
EP   1744590    1/2007
(Continued)

OTHER PUBLICATIONS

"Wikipedia: Mischpult; Version dated May 18, 2011", Wikipedia: Mischpult; Version dated May 18, 2011 (http://de.wikipedia.org/w/index.php?title=Mischpult&oldid=88970853).
"Wikipedia: Schnittstelle", Wikipedia: Schnittstelle; Version dated May 20, 2011 (http://de.wikipedia.org/w/index.php?title=Schnittstelle&oldid=89054268).

*Primary Examiner* — Alexander Jamal
(74) *Attorney, Agent, or Firm* — Perkins Coie LLP; Michael A. Glenn

(57) ABSTRACT

A sound reproduction device includes a signal processing chain configured to render an acoustic useful signal for reproduction to a listener, a simulation scenario processor configured to provide auditory scenario information for a simulated auditory scenario, the simulated auditory scenario influencing perception, by the listener, of the reproduction of the useful signal and/or defining a useful signal type, a user interface configured to detect reproduction parameter settings from a user which represent an individual preference of the listener in view of the simulated auditory scenario, a signal modifier configured to receive the reproduction parameter settings and modify reproduction of the useful signal in dependence on the reproduction parameter settings, and a storage provided for storing the reproduction parameter setting and the auditory scenario information relative to one another. Further aspects relate to a method for training user-defined and auditory scenario-dependent reproduction parameter settings for a sound reproduction device, and a corresponding computer program.

12 Claims, 7 Drawing Sheets

(51) Int. Cl.
  *H03G 5/02*    (2006.01)
  *H03G 5/16*    (2006.01)

(56) References Cited

U.S. PATENT DOCUMENTS

2008/0212788 A1   9/2008  Bech et al.
2009/0296605 A1*  12/2009 Lewis .................... H04L 67/12
                                                      670/259
2011/0010269 A1*  1/2011  Ballard ................. B60Q 5/008
                                                      705/26.41

FOREIGN PATENT DOCUMENTS

| JP | H04-00809   |   | 8/1999  |
| JP | H11-232787  | A | 8/1999  |
| JP | 2002362241  | A | 12/2002 |
| JP | 2008201253  | A | 9/2008  |
| JP | H05-068116  | A | 3/2015  |
| KR | 100184967   |   | 12/1998 |
| KR | 1020010096313 |  | 11/2001 |
| KR | 1020050062201 |  | 6/2005  |

* cited by examiner

SOUND REPRODUCTION DEVICE INCLUDING AUDITORY SCENARIO SIMULATION

CROSS-REFERENCE TO RELATED APPLICATIONS

This application is a continuation of copending International Application No. PCT/EP2012/059087, filed May 15, 2012, which is incorporated herein by reference in its entirety, and additionally claims priority from German Patent Application No. 102011076484.4, filed May 25, 2011, which is also incorporated herein by reference in its entirety.

BACKGROUND OF THE INVENTION

The present invention relates to sound reproduction devices, to an interface for exchanging user-defined, auditory scenario-dependent reproduction parameter settings, to an audio system comprising such an interface, to a data structure for a reproduction parameter setting and associated auditory scenario information, to a method for training user-defined and auditory scenario-dependent reproduction parameter settings for a sound reproduction device, and to a corresponding computer program.

Reproducing acoustic signals recorded at a different location and/or a different time plays an important role in many regions of everyday life. The purpose of such a sound reproduction may, for example, be providing the listener with information or entertaining the listener. The terms "sound reproduction" and "sound reproduction device" relate to reproducing sound or acoustic signals in general. In order to cover the great number of varying situations of applying sound reproduction, a plurality of recording, storing and reproduction devices have been developed in the past.

The reproduction of an acoustic signal recorded before and/or at a different location typically differs from the original signal, which may be attributed to the limiting characteristics of the recording, storing and reproduction devices used. Most common sound reproduction devices allow a user or listener to adjust sound reproduction in dependence on his or her preferences. An example of such an adjustment is setting the volume of sound reproduction. Sound or tone characteristics may also be set in most sound reproduction devices, which has an effect on the different frequency ranges of the acoustic signal to be reproduced, so that the user is able to emphasize certain frequency ranges of the acoustic signal. However, other frequency ranges might be reproduced in an attenuated manner. Such sound or tone preferences, such as, for example, with regard to the frequency response of music, are dependent on the user or listener.

However, existing sound reproduction devices exhibit relatively limited ways of adjusting the sound, such as, for example, loudness, bass and treble, which may be set using a user interface of the sound reproduction device. The user interface may exemplarily include electro-mechanical control knobs or buttons or other regulating options for the user. In this way, the user may set the reproduction parameters of sound reproduction and in this way adjust same to different acoustic signals. Thus, the type of the acoustic signal may be significant, wherein the type of acoustic signal may indicate a classification of the information transferred by means of the acoustic signal. Examples of potential signal types are: popular music, rock music, speech. Furthermore, relatively frequently, the user may adjust the reproduction parameters, with regard to external disturbing noise or influence, such that the desired acoustic signal differs sufficiently from the disturbing noise so as to be differentiated therefrom.

Both the characteristics of the acoustic signal to be reproduced and the characteristics of the external disturbing noise typically vary over time. This means that typically they are not static but dynamic. Exemplarily, in an automobile, the acoustic conditions (such as ambient noise) change continuously while driving, so that different concealing effects interact with the set sound setting and, thus, sound preferences are dependent on the driving situation. Concealing (also referred to as masking effect) is a characteristic of human hearing according to which certain signal portions cannot be perceived or only be perceived in an altered manner in a simultaneous or temporally offset noise or overall sound. This means that a strong disturbing noise may cause the listener to hardly be able to perceive the useful signal, even if the disturbing noise is mainly in a limited frequency range.

Referring back to the example of reproducing sound in an automobile, a user may wish different settings for different driving situations. In this case, reproduction parameters must be set again by the user for the new driving situation. This means that the user really has to be in the driving situation in order to adjust the sound to said situation.

Some developments in the field of sound reproduction devices in motor vehicles allow certain reproduction parameters to be set automatically depending on the driving situation. Exemplarily, some radios in automobiles adjust the volume to the speed, i.e. the volume of the radio in an automobile increases with an increasing speed of the automobile itself. For this purpose, such radios in automobiles frequently comprise an interface to an on-board computer or a tachometer of the automobile in order to be able to detect the present speed of the automobile. The extent of increasing the volume here may be predetermined, such as, for example, in the form of a characteristic curve of increasing the volume over speed. Other systems are able to store the current driving situation and to associate sound settings selected by the user to certain situations. When the automobile is in a similar driving situation at a later point in time, the stored sound setting is retrieved and applied to the sound reproduction of the useful signal. U.S. Pat. No. 5,844,992, for example, describes a fuzzy logic device for automatic sound control in order to set a sound level, using automatic controls, such that the surroundings and operating conditions under which an audio device is operated may be considered. The control device may be personalized by inputting personal settings by a listener. For this purpose, the audio device comprises operating buttons for varying output amplification or bass-treble balance, which allow the listener to perform personal settings. The controller comprises converting and controlling means which scan the personal settings and correspondingly adjust thereto. This self-adjusting may be performed one after the other, for each personal setting defined. More precisely, the converting and controlling means may take into consideration the accumulation of the personal settings having been performed by the listener. Thus, the controller is able to gradually learn the personal preferences of the listener in the surroundings in which the audio device is used. However, with such a system, it is also necessary for the user to have been in a certain driving situation at least once and to have adjusted the sound to said driving situation by means of a reproduction parameter setting.

In portable sound reproduction devices, such as, for example, replay devices for files in the MP3 format, too, the listening situation may change since different types of useful signals may also be reproduced here and the surrounding noise may change.

It would be desirable to offer a user of a sound reproduction device a way of being able to set reproduction parameters for different listening situations depending on individual preferences, irrespective of the respective auditory situation currently present. It would also be desirable to offer, for example to persons hard of hearing, a way of permanently adjusting reproduction parameter settings for a sound reproduction device to different auditory situations in an easy and comfortable manner.

SUMMARY

According to an embodiment, a motor vehicle audio system may have a sound reproduction device having: a signal processing chain configured to render an acoustic useful signal for reproduction to a listener; simulation scenario means configured to provide auditory scenario information for a simulated auditory scenario, the simulated auditory scenario relating to vehicle noises which may be perceived in a certain state of motion of a motor vehicle inside the passenger area, and the simulated auditory scenario influencing perception, by the listener, of the reproduction of the useful signal and/or defining a useful signal type; a user interface configured to detect reproduction parameter settings from a user which represent an individual preference of the listener in view of the simulated auditory scenario; a signal modifier configured to receive reproduction parameter settings and modify reproduction of the useful signal in dependence on the reproduction parameter settings; and a storage for storing the reproduction parameter setting and the auditory scenario information relative to one another.

According to another embodiment, a method of sound reproduction in a motor vehicle may have the steps of: rendering an acoustic useful signal by means of a signal processing chain for reproduction to a listener; providing auditory scenario information for a simulated auditory scenario, the simulated auditory scenario relating to vehicle noises which may be perceived in a certain state of motion of the motor vehicle inside the passenger area, and the simulated auditory scenario influencing perception, by the listener, of the reproduction of the useful signal and/or defining a useful signal type; detecting reproduction parameter settings from a user which represent an individual preference of the listener in view of the simulated auditory scenario; modifying reproduction of the useful signal in dependence on the reproduction parameter settings; and storing the reproduction parameter setting and the auditory scenario information relative to one another.

According to still another embodiment, a sound reproduction device may have: a signal processing chain configured to render an acoustic useful signal for reproduction to a listener; simulation scenario means configured to provide auditory scenario information for a simulated auditory scenario and generate the simulated auditory scenario itself, the simulated auditory scenario including an ambient noise simulator configured to output a noise signal associated to the simulated auditory scenario, and the simulated auditory scenario influencing perception, by the listener, of the reproduction of the useful signal and/or defining a useful signal type; a user interface configured to detect reproduction parameter settings from a user which represent an individual preference of the listener in view of the simulated auditory scenario; a signal modifier configured to receive reproduction parameter settings and modify reproduction of the useful signal, but not the noise signal, in dependence on the reproduction parameter settings; and a storage for storing the reproduction parameter setting and the auditory scenario information relative to one another.

According to another embodiment, a method for training user-defined and auditory scenario-dependent reproduction parameters for a sound reproduction device may have the steps of: reproducing an acoustic useful signal; evaluating auditory scenario information received; simulating an auditory scenario which corresponds to the auditory scenario information received or is adapted therefrom and influences perception of the sound signal reproduced by a listener and/or defines a useful signal type, simulating the auditory scenario having generating an ambient noise signal which is typical of the auditory scenario; receiving user-defined reproduction parameters which represent an individual preference of the listener in view of the simulated auditory scenario; modifying reproduction of the useful signal in accordance with the user-defined reproduction parameters received, but not the noise signal; and storing the user-defined reproduction parameters received and the auditory scenario information received relative to one another.

Another embodiment may have a computer program having program code for performing the above method for training user-defined and auditory scenario-dependent reproduction parameters for a sound reproduction device when the computer program runs on a computer.

In accordance with embodiments of the teaching presented here, a sound reproduction device includes a signal processing chain, simulation scenario means, a user interface, a signal modifier and a storage. The signal processing chain is configured to render a useful signal for reproduction to a listener. The simulation scenario means is configured to provide auditory scenario information for a simulated auditory scenario, the simulated auditory scenario influencing perception, by the listener, of the reproduction of the useful signal and/or defining a useful signal type. The user interface is configured to detect reproduction parameter settings by a user which represent an individual preference of the listener in view of the simulated auditory scenario. The signal modifier is configured to receive the reproduction parameter settings and modify the reproduction of the useful signal in dependence on the reproduction parameter settings. The storage is configured for storing the reproduction parameter setting and the auditory scenario information relative to one another.

The sound reproduction device may be used in connection with a simulation of an auditory scenario. An auditory scenario describes the perception of the useful signal by the listener using one or several characteristics. The auditory scenario may relate to the useful signal, external noise or acoustic signals or both the useful signal and external noise/acoustic signals. In addition, the auditory scenario may also relate to further aspects of perception by the listener, such as, for example, information on the acoustic conditions of the surroundings where reproduction takes place (such as, for example, reverberation, mono, stereo, 5.1 or 7.1 reproduction, headsets, etc.). If the auditory scenario defines the useful signal type, a suitable useful signal may be provided for the purpose of simulation and be reproduced using the signal processing chain. Another way is for the simulation scenario interface to determine the kind of useful signal of a currently reproduced useful signal and to select the suitable auditory scenario using this information (and maybe further information). In this way, the settings, made by the user, of the reproduction parameters may be associated to the correct auditory scenarios. The listener may be the same person as the user, or another person.

The reproduction parameter setting the user can make using the user interface may take place directly or indirectly. Direct reproduction parameter setting would correspond to setting the classic parameters, such as, for example, volume, treble, bass, etc. The number of potential parameters has increased considerably over the last few years, caused, for example, by equalizers, ex-bass, "meta" settings, such as speech, rock, jazz. Indirect reproduction parameter setting means methods in which the user either describes his or her perception, i.e., for example, "too sharp", or scales same, i.e., for example, from "too soft" to "too sharp" in 10 stages, from which the usual parameters available are derived, i.e., for example, equalizer settings. On the other hand, tests may also be performed on the user, like, for example, a speech test for checking on the understandability of speech so as to derive parameters allowing optimum speech understanding.

The signal modifier allows the listener to directly hear and/or estimate the effects of the settings of the reproduction parameters performed on his or her perception of the useful signal. In particular, the listener can determine whether, in a certain auditory scenario, the reproduction parameters selected allow reproducing the useful signal in accordance with her or his individual preferences. Assuming the listener is particularly interested in speech messages to be reproduced as clearly and understandably as possible, the listener will select the reproduction parameters such that this goal will be achieved. However, when the useful signal is music, the useful signal is to be reproduced a little softer since the listener wishes the music only as background music. However, another listener may really prefer the opposite, i.e. relatively clear reproduction of music and speech being reproduced in the background.

As has been mentioned above, the auditory scenario may also relate to different disturbing noises or tones from the surroundings. By simultaneously perceiving the useful signal and the disturbing noise, the listener is able to determine whether, with the settings of the reproduction parameters performed, the useful signal really behaves relative to the disturbing noise as desired. If desired, the user may change the reproduction parameters using the user interface. Typically, the signal modifier influences only reproduction of the useful signal, but not reproduction of possible disturbing noise which, in the simulated auditory scenario, may also be reproduced together with the useful signal. This is reflected in the fact that the user normally has no influence on the disturbing noise during normal operation of a sound reproduction device, but may only adjust the reproduction of the useful signal correspondingly. However, it is not impossible for the signal modifier to modify, during simulation of an auditory scenario, the reproduction of the disturbing noise in dependence on the reproduction parameter settings or further reproduction parameter settings.

The individual preference of the listener is preserved for being used at a later time by storing the reproduction parameter settings and the auditory scenario information relative to one another. The auditory scenario information stored allows polling the storage using current auditory scenario information so as to be able in this way to retrieve reproduction parameter settings from the storage which are best suitable for the auditory scenario or auditory situation currently present.

The simulation scenario means may include a user interface configured to acquire the auditory scenario information as a user input. The user interface for the auditory scenario information may coincide with the user interface for the reproduction parameter setting or may be implemented separately.

In some embodiments, the user input may be used such that the simulation scenario means causes the sound reproduction means to implement the simulated auditory scenario corresponding to the auditory scenario information, i.e. perform simulation of this auditory scenario. Thus, the simulation scenario means may be configured to generate the simulated audio scenario itself. For this purpose, a certain useful signal which corresponds to the useful signal type defined by the simulated auditory scenario may be output using the signal processing chain. Correspondingly, the signal processing chain may be configured to render a noise signal for reproduction to the listener, the noise signal being associated to the auditory scenario. The certain useful signal mentioned before may be predetermined for the auditory scenario, or it may be selected from useful signals available by means of so-called information on the genre (such as, for example, pop, rock, jazz, etc.). Information on the genre are made available from a plurality of sound signal sources. The ID3 data structure in connection with MP3 files, the way of identifying titles of a compact disc (CD) by means of a central database (such as, for example, CompactDisc DataBase, CDDB), and emitting a corresponding characteristic by radio transmitters when using a radio data system, such as "Radio Data System (RDS)", are to be mentioned exemplarily. Alternatively or additionally to taking into consideration a defined useful signal type, disturbing or ambient noise may be taken into consideration by the simulated auditory scenario such that the simulation scenario means performs simulation on surroundings where such disturbing or ambient noises occur. Simulation may include reproduction of stored sounds or production thereof, for example by means of a synthesizer. The simulation scenario means may include a surroundings noise simulator configured to output a noise signal which is associated to the auditory scenario simulated.

In different embodiments from those described in the above paragraph, the actual simulation of the auditory scenario is performed outside the sound reproduction device. This may exemplarily be generating the disturbing and ambient noises by another sound reproduction device as close to reality as possible for the listener. The user may configure the other sound reproduction device correspondingly in accordance with a certain auditory scenario, at least as regards the aspect of disturbing or ambient noises. Using the user interface of the simulation scenario means of the first sound reproduction device (used for reproducing the useful signal), the user can input the same auditory scenario information with regard to the certain auditory scenario in order for said information to be considered when storing the reproduction parameter settings by the storage of the sound reproduction device. As an alternative to such a manual input of the same auditory scenario information into both sound reproduction devices, it would also be possible for the two sound reproduction devices to communicate with each other with regard to the auditory scenario information while performing the auditory scenario simulation or afterwards.

In accordance with further embodiments, it may be provided for the sound reproduction device to include a normal operation scenario interface, a storage access unit and reproduction parameter setting rendering. The normal operation scenario interface is configured to receive second auditory scenario information to a real auditory scenario. The listener is exposed to said real auditory scenario at a time during normal operation of the sound reproduction device. The storage access unit is configured for polling the storage for the second auditory scenario information and providing at least one reproduction parameter setting provided. The auditory scenario information having been stored with regard to the reproduction parameter setting provided is sufficiently similar or identical to the second auditory scenario information. The reproduction parameter setting rendering is configured to establish and provide for the signal modifier, on the basis of the at least one reproduction parameter setting provided, a second reproduction parameter setting for modifying a useful signal during normal operation.

The sound reproduction device includes an operation type selector configured to switch the sound reproduction device to a learning type of operation or a normal type of operation. During the learning type of operation, user-adjusted reproduction parameter settings are stored with regard to auditory scenario information present in the meantime (i.e. at the same time as adjusting the reproduction parameter settings by the user). During the normal type of operation, the reproduction parameter settings stored before are applied, by the signal modifier, to a useful signal to be reproduced in the normal type of operation when there is sufficient similarity or identity between the auditory scenario information and the second auditory scenario information. Thus, the auditory scenario information has been stored together with and relating to the reproduction parameter settings stored before. The second auditory scenario information is present during the normal type of operation at a certain time and describes an auditory scenario present at said time.

The sound reproduction device may include a sound signal input for an ambient noise signal and a sound signal analyzer configured to determine the auditory scenario information on the basis of the ambient noise signal. The sound signal input (such as, e.g., a microphone including an analog-to-digital converter) may, apart from the ambient noise signal, also receive different signals, in particular the useful signal. The ambient noise signal may be separated from the remaining signals by suitable measures. In particular, the useful signal may frequently be subtracted from the signal received, since the useful signal is mostly known. When reproducing in spaces (such as, e.g., a vehicle), typically there is also an unknown transfer function of space (such as, e.g., reverberation) so that the useful signal emitted by a loudspeaker or the like differs from the useful signal received at the sound signal input. The result of this is that the useful signal received at the sound signal input typically may only be determined approximately from the known useful signal, which, however, may be sufficient in many cases of application. The sound signal analyzer may determine signal characteristics of the ambient noise signal recorded, such as, for example, a frequency spectrum. The signal characteristics determined may be used to poll the storage and in this way determine data sets exhibiting similar signal characteristics. These data sets may be used to find reproduction parameter settings which are suitable for the current auditory scenario.

The sound reproduction device may also include an output interface configured to transfer data sets to an external communication partner. In this way, the individual preferences of the listener, once determined, may be transferred to further sound reproduction devices, without the listener having to again perform simulation.

In accordance with the teaching disclosed, adjusting the sound characteristics or reproduction parameters for situation-dependent auditory surroundings is performed by a simulation and/or, if applicable, also by externalization. One possible application of the teaching disclosed is as follows: the acoustic conditions as really present while driving are simulated realistically using an external device (such as, e.g., a smartphone with a headset) or by simulating the driving noise using the sound system of a vehicle. Thus, the conditions simulated represent a great variety of practically arising situations, wherein typically at the same time the smallest possible number of simulations are performed. The user sets, for each situation simulated (in particular different driving situations), the sound preferences (exemplarily frequency weighting) at the external device or using a multimedia unit of the vehicle to an optimum. Using an interface, the settings obtained in this way are transmitted from the external device to the sound system of the vehicle or taken over directly by the sound system which then provides the optimum sound settings for the user, exemplarily by interpolating the simulated situations for every real driving situation. Here, the driving situation has to be determined while driving, which exemplarily takes place by reading the speed of driving and the number of revolutions of the engine using on-board electronics or by direct acoustic analysis.

The technical teaching disclosed allows simplifying setting sound preferences in an automobile or for audio systems of the automobile so that manual post-adjusting while driving can be avoided. This results in a increase in security, since there is no setting of complex reproduction parameters while driving. With simulations within the (stationary) automobile or vehicle, there is the peace and quiet necessitated for setting, since today's systems comprise a large number of menus which are difficult to use. When setting at an external device, an additional advantage is that the operating interfaces are familiar to the user (such as, e.g., uniform interfaces, operating concepts and courses of interaction within an operating system) compared to the menu setup of the special multimedia device in the automobile.

BRIEF DESCRIPTION OF THE DRAWINGS

Embodiments of the technical teaching disclosed will be discussed in greater detail below referring to the appended drawings, in which.

DETAILED DESCRIPTION OF THE INVENTION

Figure 1:
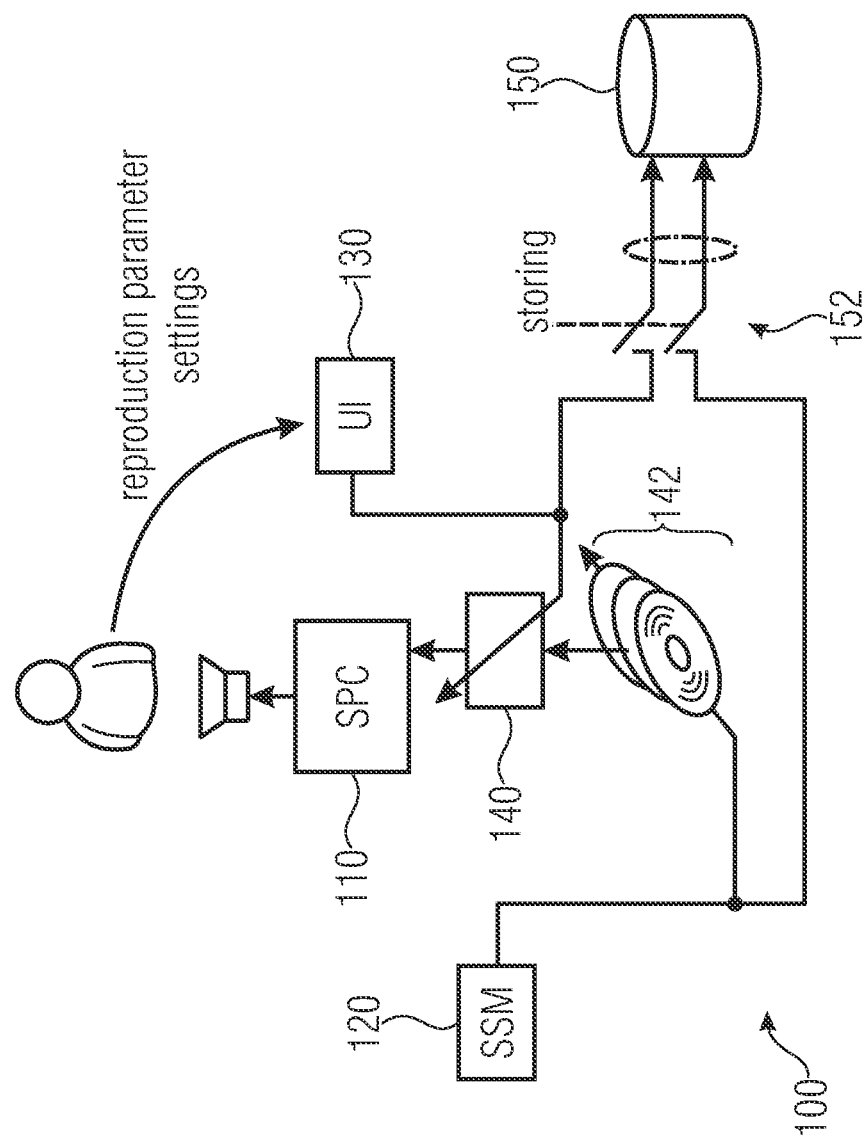
FIG. 1 shows a schematic block circuit diagram of a sound reproduction device in accordance with an embodiment of the technical teaching disclosed.

FIG. 1 shows a schematic block circuit diagram of a sound reproduction device 100 in accordance with a possible embodiment of the technical teaching disclosed here. The sound reproduction device includes a signal processing chain 110 (SPC), simulation scenario means 120 (SSM), a user interface 130 (UI), a signal modifier 140 and a storage 150. An input of the signal processing chain 110 is connected to the signal modifier 140. Alternatively, the signal modifier 140 may also be part of the signal processing chain 110 or be connected to an output of the signal processing chain 110. An output of the signal processing chain 110 is connected to a loudspeaker via which a useful signal for a listener may be output. The useful signal is selected from a plurality of useful signals 142 which are stored on storage media. For illustration purposes, the storage media in FIG. 1 are illustrated to be Compact Discs, however other storage media or signal sources may also be used (such as, e.g., radio transmission, audio files, mobile telephone interface, etc.).

The simulation scenario means 120 is used when the sound reproduction device 100 is in a learning type of operation. The user may place the sound reproduction device 100 in the learning type of operation using a corresponding user input, such as, for example, using the user interface 130. During the learning type of operation, at least one simulated auditory scenario is processed by the simulation scenario means 120. Usually, a plurality of auditory scenarios are processed during the learning type of operation. Auditory scenario information which describes representative characteristics of the auditory scenario is associated to each auditory scenario simulated. In the embodiment shown in FIG. 1, the simulation scenario means 120 controls selecting the useful signal from the plurality of useful signals 142. Said selection of a special useful signal may be done on the basis of a useful signal type of the useful signal selected which coincides with or is close to an auditory scenario useful signal type which is defined in the currently simulated auditory scenario. Alternatively, the useful signal which is to be reproduced in the auditory scenario may also be stored together with the auditory scenario information, such as, for example, as a digital audio file.

The useful signal selected is output to the listener via the signal processing chain 110. The listener or user (mostly the same person) will set the reproduction parameters using the user interface 130 such that the reproduction of the useful signal corresponds to the individual preferences of the user. The user interface 130 passes the reproduction parameter setting on to the signal modifier 140 which adjusts the reproduction of the useful signal correspondingly. In this way, the listener may influence the volume, equalizer settings and, maybe, further reproduction parameters. If the listener is satisfied with the settings performed, he or she may cause the sound reproduction device to store the reproduction parameters in connection with the current auditory scenario information. This is illustrated schematically for illustrational purposes in FIG. 1 by a double switch 152 which connects an output of the user interface 130 and an output of the simulation scenario means 120 to the storage 150 when the user issues an instruction for storing the settings performed relative to the current auditory scenario. In many sound reproduction devices, the reproduction parameter settings performed and the current auditory scenario information are typically buffered as variables in an operating memory of a microprocessor or microcontroller during runtime. When the user issues the instruction for storing, the values of these variables are exemplarily copied or written to the non-volatile storage 150 relative to one another.

The decision as to which auditory scenarios are processed by the simulation scenario means 120 in which order may either be input by the user via a user interface 130 or another interface (not shown). Another way is for the simulation scenario means 120 to process a predetermined order of different auditory scenarios when starting the learning type of operation.

Figure 2:
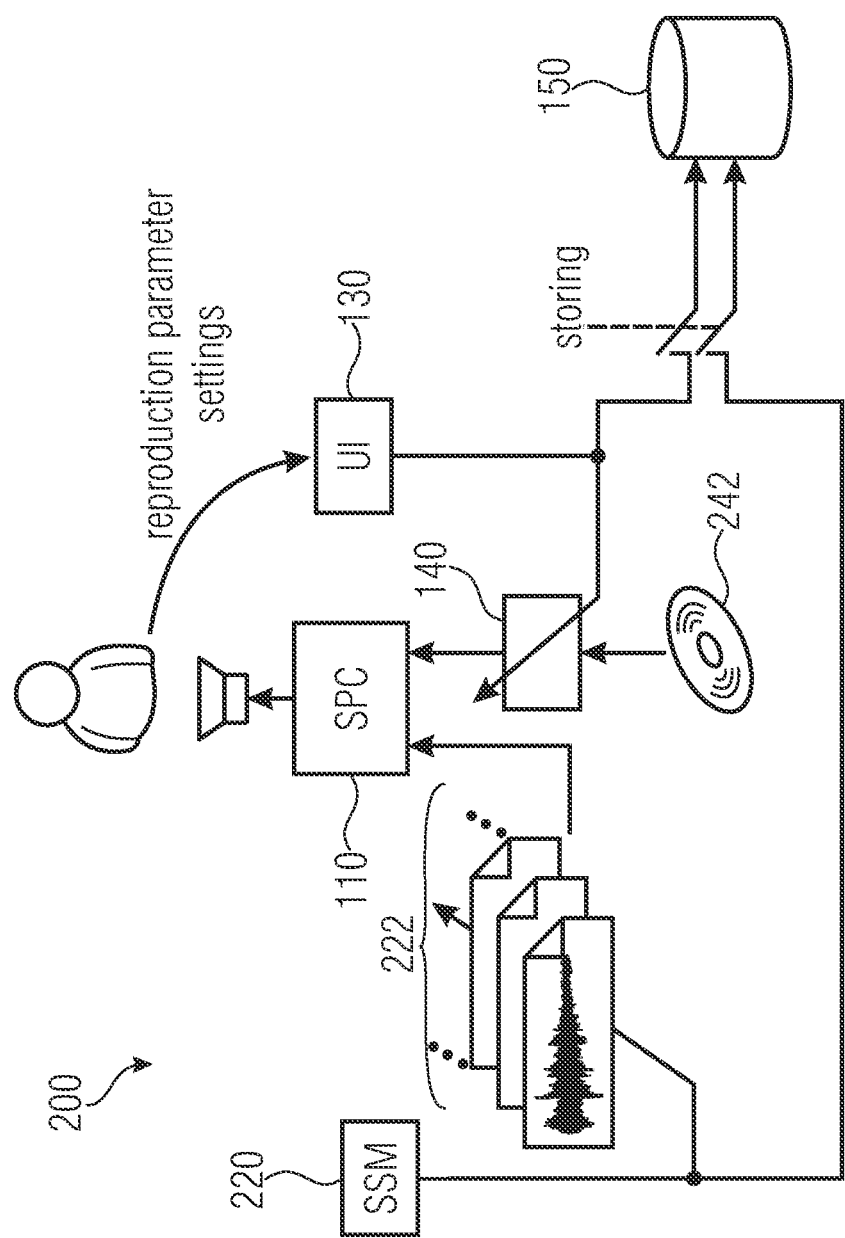
FIG. 2 shows a schematic block circuit diagram of a sound reproduction device in accordance with another embodiment of the technical teaching disclosed.

FIG. 2 shows a schematic block circuit diagram of a sound reproduction device 200 in accordance with another potential embodiment of the teaching disclosed. In contrast to the previous embodiment, an auditory scenario in the embodiment in accordance with FIG. 2 does not refer to the useful signal, but to ambient or disturbing noise. The useful signal originates from a signal source 242 and is output to the listener via the signal modifier 140 and the signal processing chain 110.

In parallel to the useful signal, a noise signal may be output to the listener via the signal processing chain 110. The noise signal may exemplarily originate from a collection of noise signals 222. The noise signal of the collection 222 may exemplarily be stored in audio files. The simulation scenario means 220 is configured to select a noise signal from the collection of noise signals 222 which is associated to an auditory scenario which currently is to be taken into consideration for simulation. Since the noise signal is output simultaneously with the useful signal, concealing or masking effects do occur between the two signals. A large number of listeners wish the useful signal to be clearly and distinctly perceivable in relation to the noise signal, however at the same time not to be reproduced in an excessively loud or unnatural manner. This wish may apply for the useful signal as a whole, or else for individual frequency ranges of the useful signal. Many disturbing noise signals comprise frequency ranges in which the noise signal is stronger than in other frequency ranges. This offers a way of modifying the useful signal differently in different frequency ranges so as to fulfill the listeners wish for a clear, distinct, but not too loud or unnatural reproduction of the useful signal for all frequency ranges.

In the learning type of operation of the sound reproduction device 200, a combined signal including the useful signal and the noise signal is played to the listener, the noise signal being associated to the current auditory scenario. Specifically, this may indicate that the auditory scenario simulates a real auditory situation in which the listener of the sound reproduction device 200 may be. One example is for the sound reproduction device and the listener to be located in a vehicle which may take different states of motion (city traffic, country roads, motorways, etc.). An auditory scenario represents the influence of a certain state of motion of the vehicle relative to the noises resulting. The listener or user may set the reproduction parameters for the useful signal using the user interface 130 until he or she has found a reproduction parameter setting of preference. In this way, the listener is able to find for a certain auditory scenario a comprise between a clear contrast of the useful signal from the noise signal and a moderate volume of the useful signal which is pleasant for him or her.

As in the embodiment shown in FIG. 1, reproduction parameter settings performed with regard to the auditory scenario information may be stored in the storage 150 as a result of a corresponding user input.

Figure 3:
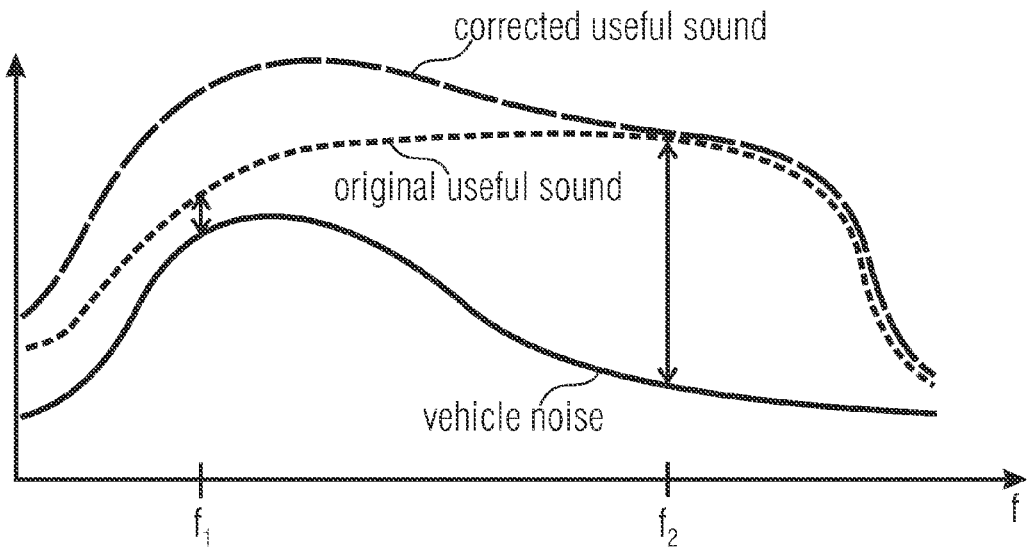
FIG. 3 shows schematic frequency spectra of an original useful signal, a disturbing noise in a first auditory situation and the useful signal after having been modified in accordance with a first reproduction parameter setting.

FIG. 3 shows schematic frequency spectra of an original useful signal, a disturbing noise in a first auditory situation and the useful signal after having been modified in accordance with a first reproduction parameter setting. The spectrum of the original useful signal exhibits the course shown in FIG. 3, which is to be taken as an example. For illustration purposes, it is assumed that the first auditory situation is the noise, produced by a motor vehicle, inside the motor vehicle while driving at a relatively low number of revolutions. A portion of the vehicle noise corresponds to the engine noise. At a low number of revolutions, the engine noise predominantly comprises frequency portions at low frequencies, which in FIG. 3 is illustrated by a maximum of the frequency spectrum of the vehicle noise at low frequencies.

As may be seen in FIG. 3, the level distance between the original useful signal and the vehicle noise is relatively low with a relatively low frequency $f_1$. With a higher frequency $f_2$, however, the level distance is greater. The listener can differentiate frequency portions of the useful signal at the frequency $f_1$ from the noise signal only poorly. Frequency portions of the useful signal which are in proximity to the frequency $f_2$, however, are sufficiently strong compared to the noise signal so that the listener will typically not have any problems in perceiving the useful signal clearly and distinctly in this frequency range.

In order to be able to perceive the useful signal sufficiently clearly over the entire frequency spectrum of interest, the listener may perform correction or modification of the original useful signal. The frequency spectrum of the useful signal corrected or modified in this way is illustrated in FIG. 3 as a broken line. In order to be able to perform correction of the useful signal, with conventional sound reproduction devices, the listener has to change the reproduction parameters, such as, for example, volume and equalizer settings, while the first real auditory situation is present, i.e. while the motor vehicle is driving.

Figure 4:
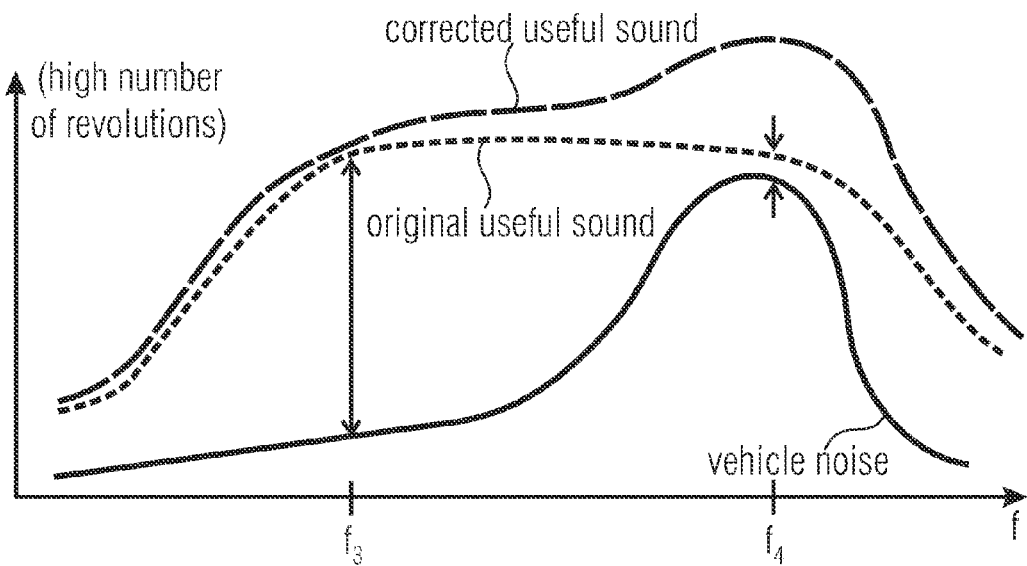
FIG. 4 shows schematic frequency spectra of an original useful signal, a disturbing noise in a second auditory situation and the useful signal after having been modified in accordance with a second reproduction parameter setting.

FIG. 4 shows a similar illustration to FIG. 3 for comparative purposes, however with a second real auditory situation which corresponds to a state of motion at a higher number of revolutions of the engine of the motor vehicle. The frequency spectrum of the vehicle noise now exhibits a maximum at a relatively high frequency $f_4$, whereas it is weak at a relatively low frequency $f_3$. Correction of the original useful signal here will be raising the useful signal in a frequency range around the frequency $f_4$. In this way, a relatively balanced level distance between the useful signal and the noise signal can be generated.

Figure 5:
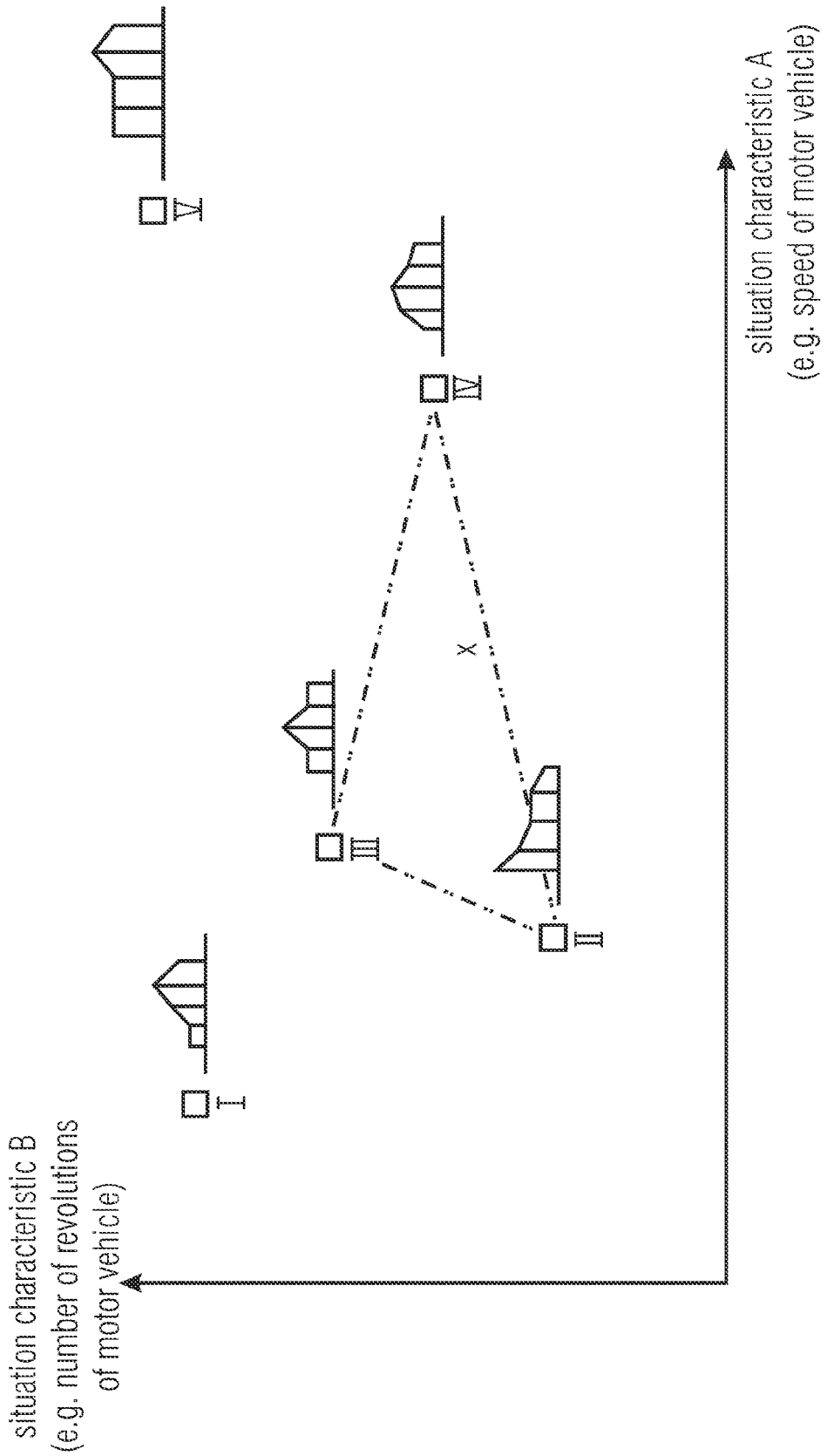
FIG. 5 schematically illustrates a characteristic space of auditory scenario characteristics comprising some data sets stored which each include auditory scenario information and a reproduction parameter setting stored relating thereto.

FIG. 5 illustrates a characteristic space in which five data sets stored are illustrated graphically. The characteristic space in the example illustrated in FIG. 5 is two-dimensional, however may also comprise a different number of dimensions. A first dimension is plotted along the abscissa and may exemplarily correspond to the speed of a motor vehicle. A second dimension is plotted along the ordinate and may exemplarily correspond to the number of revolutions of the motor vehicle. The dimensions may also be referred to as situation characteristics. In the example illustrated in FIG. 5, each data set includes a set of situation characteristics and a set of reproduction parameters. The situation characteristics serve for identifying the data set. Alternatively, a data set may also comprise a different structure or a different content. Exemplarily, instead of the situation characteristics, the data set may include an identifier for a certain combination of situation characteristics.

In the example illustrated in FIG. 5, each of the five data sets I, II, III, IV and V illustrated includes a certain clear combination of situation characteristics. Thus, data set I is associated to a high number of revolutions at a low speed, corresponding to a situation as arises when driving in low gear, such as, for example, on steep slopes. Data set II, however, is associated to a low number of revolutions and a low speed, exemplarily corresponding to a situation while driving in city traffic. Furthermore, each of the five data sets includes a certain equalizer setting, which is illustrated schematically in FIG. 5. The equalizer setting stored in data set I raises the useful signal in a high frequency range a little. The equalizer setting of data set II increases the useful signal in a low frequency range. The five data sets I to V may have been stored during learning operation of a sound reproduction device in which the respective vehicle noise has been reproduced together with the useful signal in the simulation of the respective auditory scenario.

Figure 6:
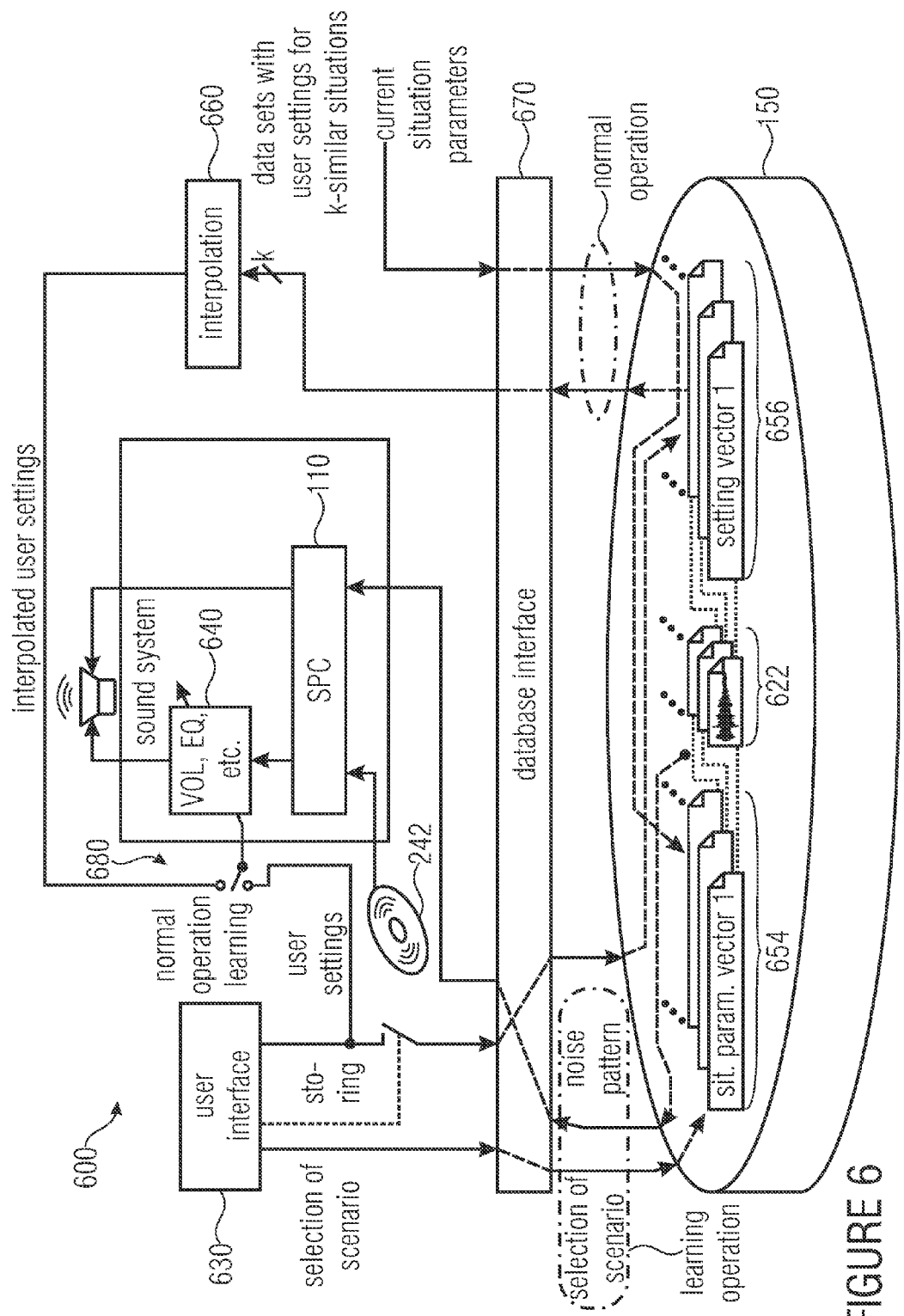
FIG. 6 shows a schematic block circuit diagram of a sound reproduction device in accordance with another embodiment of the technical teaching disclosed.

During normal operation of the sound reproduction device or also a different sound reproduction device which has access to data sets I to V, a driving situation of the motor vehicle as is characterized in FIG. 6 by a cross may arise. In order to determine an equalizer setting reflecting the preferences of the listener in the best way possible, the k data sets which are closest may be established using metrics. In the example illustrated, these are data sets II, III and IV at k=3. On the basis of the data sets established, a reproduction parameter setting may be determined, using which the reproduction of a useful signal may be modified during normal operation. Different options may be considered for determining the reproduction parameter setting mentioned, such as, for example, averaging the equalizer settings of data sets II to IV, interpolation or a different function. In this way, reproduction parameter settings for auditory situations in between may also be determined using a limited number of data sets. Psycho-acoustic findings may also be taken into consideration when determining the reproduction parameter settings.

FIG. 6 shows a schematic block diagram of a sound reproduction device 600 in accordance with another potential embodiment of the technical teaching disclosed. A useful signal is provided by a useful signal source 242, which is output via the signal processing chain 110 and the signal modifier 640 (here downstream of the signal processing chain). The signal processing chain 110 and the signal modifier 640 are part of a sound system or audio system. The sound reproduction device 600 may be switched to learning operation or normal operation using a switch 680. In the learning type of operation, reproduction parameter settings applied to the useful signal by the signal modifier 640 are provided by the user interface 630. During the learning type of operation, a scenario selection is transmitted from the user interface 630 to a database interface 670. The database interface 670 polls a database 150 for suitable data sets. Suitable data sets are data sets in which a situation parameter vector 654 coincides with the scenario selection. Alternatively, polling the database 150 may also take place by means of an identifier of a data set. As a response to polling, the database 150 provides a noise pattern from a selection of noise patterns 622, the noise pattern provided being associated to the data set requested. The noise pattern is output to the listener via the signal processing chain 110, however without passing through the signal modifier 640. The listener performs changes to the reproduction parameters for reproducing the useful signal using the user interface 630. If the listener likes the reproduction parameter settings performed, he or she will cause, using the user interface 630, these reproduction parameter settings to be stored as a setting vector 656 in the corresponding data set in the database 150.

During normal operation of the sound reproduction device 600, the sound reproduction device 600 receives current situation parameters which may exemplarily be provided by an on-board computer of a motor vehicle via an interface of the sound reproduction device 600 and represent information on a state of motion of the motor vehicle. Another option is, for example, a microphone recording ambient noise and a sound signal analyzer (not shown) calculating from this current values for situation parameters or characteristics, such as, for example, a frequency spectrum of a noise signal. The situation parameters are transferred to the database interface 670 which polls the database 150 with the information contained therein. Typically, none of the data sets stored will correspond precisely to the situation parameters. However, using metrics in the characteristic space, data sets which are sufficiently similar may typically be determined. The sufficiently similar data sets (number k) are transferred to an interpolator 660 which is configured to generate interpolated reproduction parameter settings and provide same to the signal modifier 640.

Figure 7:
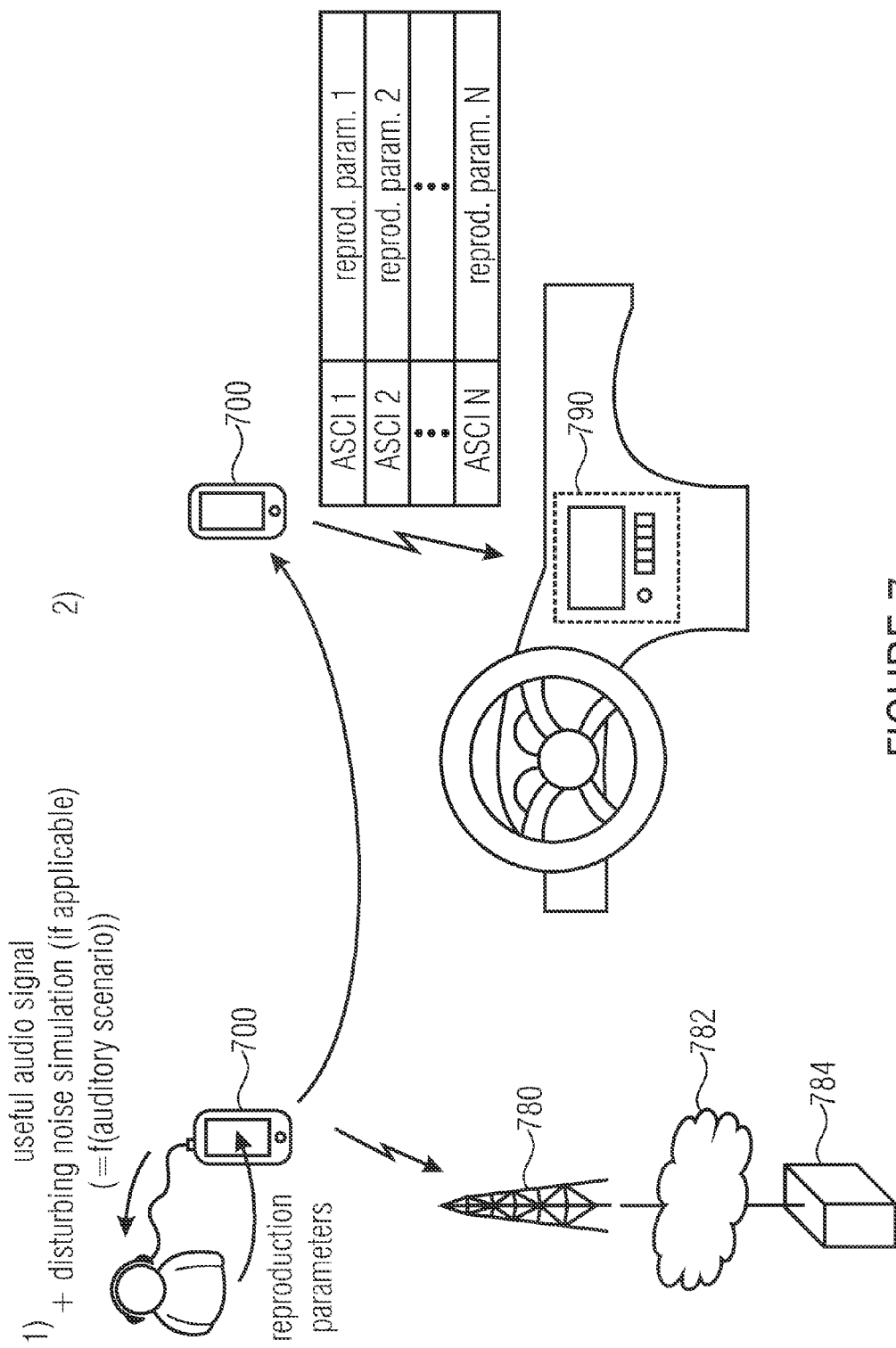
FIG. 7 illustrates interaction between a user or listener, a first sound reproduction device and a second sound reproduction device.

FIG. 7 illustrates interaction between a listener/user, a first sound reproduction device and a second sound reproduction device. In a first phase, the user uses the first sound reproduction device 700 to simulate an auditory scenario or several auditory scenarios. Here, the first sound reproduction device 700 outputs a useful signal and, if applicable, also a (disturbing) noise signal to the listener. The useful signal and/or noise signal are/is defined by an auditory scenario each, meaning that same are a function of the auditory scenario. The auditory scenario may be stored on or in the sound reproduction device or the sound reproduction device may be configured to communicate with a remote source 784 for auditory scenarios. In the example illustrated in FIG. 7, the sound reproduction device 700 may communicate to a mobile radio station 780 wirelessly which in turn is connected to a network 782. The remote source 784 is also connected to the network 782 and may exemplarily be a server. In this way, the sound reproduction device 700 may receive data sets for auditory scenarios from the remote source 784. Typically, the data sets include an auditory scenario information by means of which the sound reproduction device 700 may simulate the auditory scenario. A data set may also include a respective disturbing noise present as a digital audio signal.

After the listener, in the first phase, has set the reproduction parameters according to his or her individual preferences for at least one auditory scenario and has stored same with regard to said auditory scenario, the first sound reproduction device may be used in a second phase to transmit the individually adjusted data sets to the second sound reproduction device 790. Each data set includes the auditory scenario information ACSI and the reproduction parameters set by the user. In the example illustrated, N data sets are transmitted. The first sound reproduction device 700 and the second sound reproduction device 790 each comprise an interface allowing communication between the two sound reproduction devices 700 and 790 and data set transmission. The interface may exemplarily be a wireless interface, such as WLAN or Bluetooth, a wired interface, such as USB (universal serial bus), or an infrared interface. The interface is configured to process the data sets to be transmitted or received as intended. This means that the interface interacts with the storage 150 so as to read out the data sets correctly from the memory and/or store same correctly on the receiver side. From the perspective of the first sound reproduction device 700, the second sound reproduction device 790 represents an external communication partner. The external communication partner, however, need not necessarily be another sound reproduction device, but may be any device which comprises a corresponding interface. In this way, data backup copies of the data sets may exemplarily be created on a Flash memory or a USB stick.

In the example shown in FIG. 7, the second sound reproduction device is illustrated as an audio system in a motor vehicle. The auditory scenario information in this case may exemplarily include the following information so as to be able to reproduce auditory situations typically arising:
motor vehicle manufacturer
motor vehicle type
type of propulsion (petrol, diesel, gas, hybrid propulsion, etc.)
speed
number of revolutions
type of tires The vehicle noises may be recorded once for different types of motor vehicles and for different speeds to be then made available to a great number of users. The vehicle noises are recorded and mixed in a way such that, when being reproduced to the listener exemplarily by means of a headset, the result is a realistic perception of the real vehicle noises. For this purpose, the listener may be requested to set a volume setting of the sound reproduction device to a predetermined value. The noise signal may also be combined from several sources, exemplarily a first noise signal for the engine noise, a second noise signal for a tire noise, and a third noise signal for airstream noise. The combination of the noise signals from several sources includes mixing the noise signals, the result being the overall noise.

Figure 8:
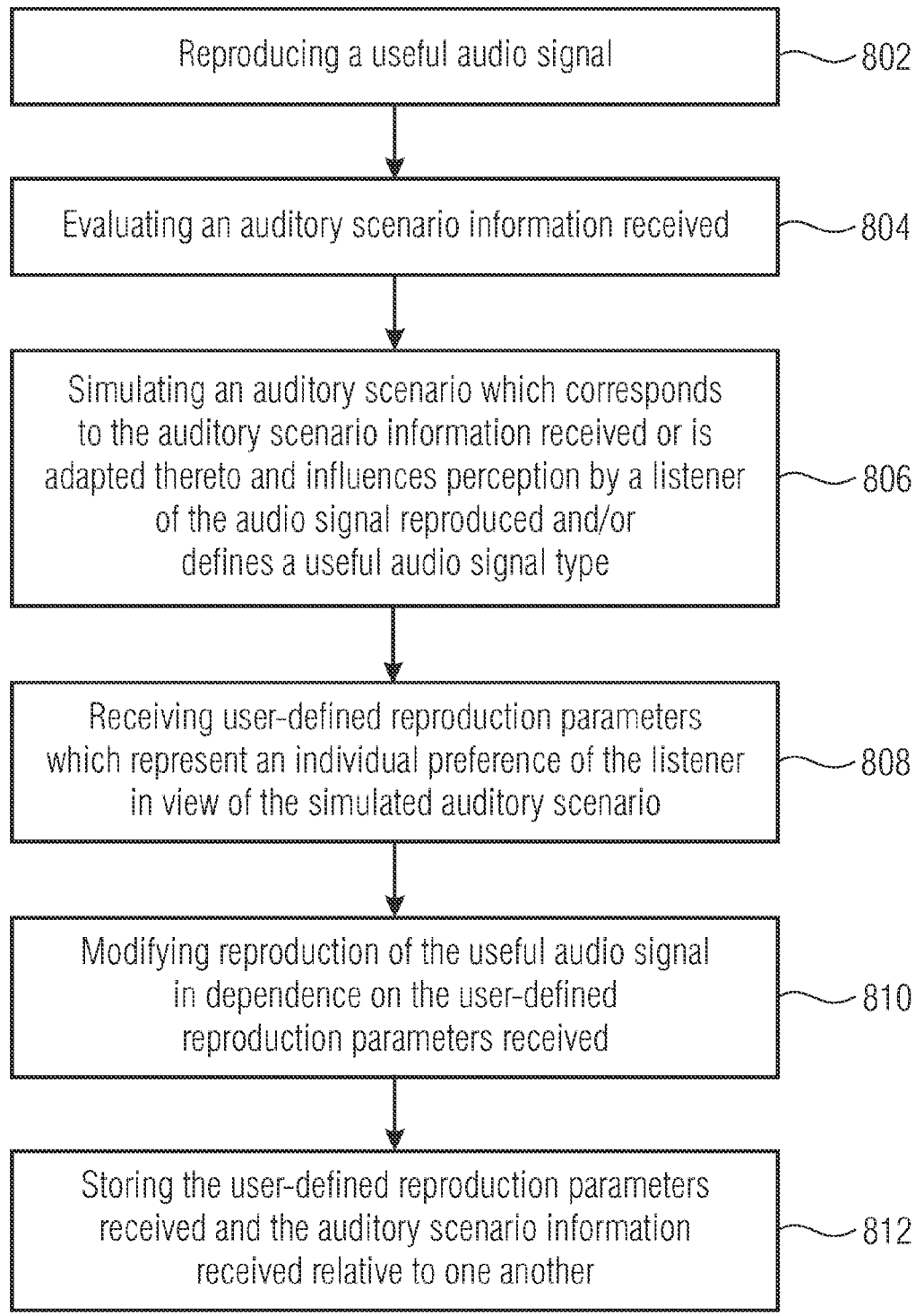
FIG. 8 shows a schematic flowchart of a method for training user-defined and auditory scenario-dependent reproduction parameters for a sound reproduction device.

FIG. 8 shows a schematic flowchart of a method for training user-defined and auditory scenario-dependent reproduction parameters for a sound reproduction device. In step 802, a useful signal is reproduced. Reproducing the useful signal may be continued while executing the other steps of the method. At 804, auditory scenario information received are evaluated. Steps 802 and 804 may be in a different order than illustrated in FIG. 8. Thus, at first, auditory scenario information may be received and evaluated. Evaluating the auditory scenario information may have an influence on which useful signal is output. At 806, an auditory scenario is simulated which corresponds to the auditory scenario information received or is adapted therefrom. The simulated auditory scenario influences perception of the reproduced acoustic signal by a listener and/or defines a useful signal type.

Another step 808 performed during the course of the method is receiving user-defined reproduction parameters which represent an individual preference of the listener in view of the auditory scenario simulated. At 810, reproduction of the useful signal is modified in dependence on the user-defined reproduction parameters received. Finally, the (last) received user-defined reproduction parameters, while the auditory scenario simulated is active, and the auditory scenario information received are stored relative to one another, as is indicated by step 812.

The technical teaching disclosed here may be applied among other things in audio systems and peripherals in vehicles. In principle, all communication or sound systems in which the listener is in varying acoustic surroundings and in which there is an option of setting sound preferences may use said teaching. In applications other than for audio systems in motor vehicles, different situation parameters may be selected. For persons traveling on trains, for example, adjusting the volume during announcements made over loudspeakers is of interest: either the loudspeaker announcement is not to interfere in the reproduction of the useful signal, which is why the useful signal is reproduced to be correspondingly louder, or the listener wants to hear the loudspeaker announcement, since he or she may otherwise miss important information on the train service. In said second case, individual preference of the listener would be rendering reproduction of the useful signal to be softer during loudspeaker announcements. The decision as to when there is a loudspeaker announcement may be done by the sound signal analyzer mentioned above.

Although some aspects have been described in connection with a device, it is to be understood that these aspects also represent a description of the corresponding method such that a block or element of a device is also to be understood to be a corresponding method step or characteristic of a method step. In analogy, aspects described in connection with a method step or as a method step also represent a description of a corresponding block or detail or characteristic of a corresponding device. Some or all of the method steps may be executed by a hardware apparatus (or using a hardware apparatus), such as, for example, a microprocessor, a programmable computer or an electronic circuit. In some embodiments, some or several of the most important method steps may be executed by such an apparatus.

Depending on certain implementation requirements, embodiments of the invention may be implemented in either hardware or software. The implementation may be using a digital storage medium, such as, for example, a floppy disc, a DVD, a Blu-ray disc, a CD, ROM, PROM, EPROM, EEPROM or FLASH storage, a hard disc drive or another magnetic or optical storage on which electronically readable control signals are stored which are able to cooperate or interact with a programmable computer system such that the respective method will be executed. This means that the digital storage medium may be computer-readable.

Some embodiments in accordance with the invention thus include a data carrier comprising electronically readable control signals which are able to interact with a programmable computer system such that one of the methods described herein will be performed.

In general, embodiments of the present invention may also be implemented as a computer program product comprising program code, the program code being operative to perform one of the methods when the computer program product runs on a computer.

The program code may exemplarily be stored on a machine-readable carrier.

Other embodiments include the computer program for performing one of the methods described herein, the computer program being stored on a machine-readable carrier.

In other words, an embodiment of the inventive method is a computer program comprising a program code for performing one of the methods described herein when the computer program runs on a computer.

Another embodiment of the inventive method is a data carrier (or a digital storage medium or a computer-readable medium) onto which the computer program for performing one of the methods described herein is recorded.

Another embodiment of the inventive method is a data stream or sequence of signals representing the computer program for performing one of the methods described herein. The data stream or sequence of signals may exemplarily be configured to be transferred via a data communication connection, such as, for example, the Internet.

Another embodiment includes processing means, exemplarily a computer or programmable logic element, configured or adapted to perform one of the methods described herein.

Another embodiment includes a computer on which the computer program for performing one of the methods described herein is installed.

Another embodiment in accordance with the invention includes a device or a system configured to transfer a computer program for performing at least one of the method described herein to a receiver. Transfer may exemplarily take place electronically or optically. The receiver may exemplarily be a computer, a mobile device, a storage device or a similar device. The device or system may exemplarily include a file server for transferring the computer program to the receiver.

In some embodiments, a programmable logic element (exemplarily a field-programmable gate array, FPGA) may be used to perform some or all functionalities of the methods described herein. In some embodiments, a field-programmable gate array may interact with a microprocessor to perform one of the methods described herein. Generally, in some embodiments, the methods are performed on the part of any hardware device. This may be universally usable hardware, such as, for example, a computer processor (CPU), or hardware specific for the method, such as, for example, an ASIC.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A motor vehicle audio system comprising a sound reproduction device comprising:
   a signal processing chain configured to render an acoustic useful signal for reproduction to a listener;
   a simulation scenario processor configured to provide auditory scenario information for a simulated auditory scenario, the simulated auditory scenario relating to vehicle noises which may be perceived in a certain state of motion of a motor vehicle inside the passenger area, and the simulated auditory scenario influencing perception, by the listener, of the reproduction of the useful signal and/or defining a useful signal type;
   a user interface configured to detect reproduction parameter settings from a user which represent an individual preference of the listener in view of the simulated auditory scenario;
   a signal modifier configured to receive reproduction parameter settings and modify reproduction of the useful signal in dependence on the reproduction parameter settings;
   a storage for storing the reproduction parameter setting and the auditory scenario information relative to one another;
   a normal operation scenario interface configured to receive second auditory scenario information for a real auditory scenario which the listener is exposed to at a time during normal operation of the sound reproduction device;

a storage access unit for polling the storage with the second auditory scenario information and for providing at least one reproduction parameter setting provided the auditory scenario information of which stored relative to one another are sufficiently similar or identical to the second auditory scenario information; and a reproduction parameter setting rendering configured to establish and provide to the signal modifier, on the basis of the at least one reproduction parameter setting provided, a second reproduction parameter setting for modifying a useful signal during normal operation.

2. The motor vehicle audio system in accordance with claim 1, wherein the simulation scenario processor comprises a user interface configured to detect the auditory scenario information as a user input.

3. The motor vehicle audio system in accordance with claim 1, wherein the simulation scenario processor comprises at least one of a radio interface, an infrared interface, a wired interface, a graphical user interface, a speech-based user interface, a tangible user interface and a natural user interface (NUI).

4. The motor vehicle audio system in accordance with claim 1, wherein the simulation scenario processor is configured to generate the simulated auditory scenario itself.

5. The motor vehicle audio system in accordance with claim 4, wherein the simulation scenario processor comprises an ambient noise simulator configured to output a noise signal associated to the simulated auditory scenario.

6. The motor vehicle audio system in accordance with claim 1, wherein the signal processing chain is also configured to render a noise signal for reproduction to the listener, the noise signal being associated to the auditory scenario.

7. The motor vehicle audio system in accordance with claim 1, further comprising an operation type selector configured to switch the sound reproduction device to a learning type of operation or a normal type of operation, wherein, during the learning type of operation, user-adjusted reproduction parameter settings with regard to auditory scenario information present in the meantime are stored and, during the normal type of operation, reproduction parameter settings stored before are applied to a useful signal to be reproduced in the normal type of operation by the signal modifier when there is sufficient similarity or identity between the auditory scenario information having been stored with regard to the reproduction parameter settings stored before and the second auditory scenario information present at a current time and describing a current auditory scenario.

8. The motor vehicle audio system in accordance with claim 1, further comprising:

a sound signal input for an ambient noise signal; and a sound signal analyzer configured to determine the auditory scenario information on the basis of the ambient noise signal.

9. The motor vehicle audio system in accordance with claim 1, wherein the reproduction parameter settings comprise at least one of a volume setting, sound setting, frequency response setting, equalizer setting, compression setting, balance setting and fader setting.

10. The motor vehicle audio system in accordance with claim 1, further comprising an output interface configured to transfer data sets which comprise the reproduction parameter setting and the auditory scenario information to an external communication partner.

11. A method of sound reproduction in a motor vehicle, comprising:

rendering an acoustic useful signal by means of a signal processing chain for reproduction to a listener;

providing auditory scenario information for a simulated auditory scenario, the simulated auditory scenario relating to vehicle noises which may be perceived in a certain state of motion of the motor vehicle inside the passenger area, and the simulated auditory scenario influencing perception, by the listener, of the reproduction of the useful signal and/or defining a useful signal type;

detecting reproduction parameter settings from a user which represent an individual preference of the listener in view of the simulated auditory scenario;

modifying reproduction of the useful signal in dependence on the reproduction parameter settings;

storing the reproduction parameter setting and the auditory scenario information relative to one another;

receiving second auditory scenario information for a real auditory scenario which the listener is exposed to at a time during normal operation of the sound reproduction device;

providing at least one reproduction parameter setting provided the auditory scenario information of which stored relative to one another are sufficiently similar or identical to the second auditory scenario information; and establishing and providing to the signal modifier, on the basis of the at least one reproduction parameter setting provided, a second reproduction parameter setting for modifying a useful signal during normal operation.

12. The method in accordance with claim 11, further comprising:

switching the sound reproduction device to a learning type of operation or a normal type of operation, wherein, during the learning type of operation, user-adjusted reproduction parameter settings with regard to auditory scenario information present in the meantime are stored and, during the normal type of operation, reproduction parameter settings stored before are applied to a useful signal to be reproduced in the normal type of operation by the signal modifier when there is sufficient similarity or identity between the auditory scenario information having been stored with regard to the reproduction parameter settings stored before and the second auditory scenario information present at a current time and describing a current auditory scenario.

* * * * *